(12) United States Patent
Maxwell et al.

(10) Patent No.: US 7,869,526 B2
(45) Date of Patent: Jan. 11, 2011

(54) SYSTEM AND METHOD FOR A SINGLE STAGE TUNABLE ULTRA-WIDEBAND PULSE GENERATOR

(75) Inventors: Erick Maxwell, Temple Terrace, FL (US); Thomas Weller, Lutz, FL (US)

(73) Assignee: University of South Florida, Tampa, FL (US)

( * ) Notice: Subject to any disclaimer, the term of this patent is extended or adjusted under 35 U.S.C. 154(b) by 1057 days.

(21) Appl. No.: 11/612,713

(22) Filed: Dec. 19, 2006

(65) Prior Publication Data

US 2007/0237208 A1 Oct. 11, 2007

Related U.S. Application Data

(60) Provisional application No. 60/597,746, filed on Dec. 19, 2005.

(51) Int. Cl.
*H04L 27/00* (2006.01)
(52) U.S. Cl. .................. 375/259; 375/141; 375/146; 375/242; 375/295
(58) Field of Classification Search .......... 375/259, 375/141, 146, 242, 295
See application file for complete search history.

(56) References Cited

U.S. PATENT DOCUMENTS 6,700,905 B1* 3/2004 Karasawa et al. ............ 372/21

OTHER PUBLICATIONS

R. Fontana, "Recent system applications of short-pulse ultra-wideband (UWB) Technology," IEEE Trans. Microwave Theory Tech., 2004, pp. 2087-2104, vol. 52, No. 9.

Federal Communications Commission, Code of Federal Regulation, Title 47, ch. 1, part 15, "Radio Frequency Devices," Sub-Part F, Ultra-Wideband, Sec. 503, 2003; pp. 767-768.

J. Taylor, Ultra-Widband Radar Technology, Boca Raton: CRC Press, 2001.

J. Han and C. Nguyen, "Ultra-Wideband electronically tunable Pulse Generators," IEEE microwave and Wireless Components Letter, vol. 14, No. 3, Mar. 2004.

J.Han and C. Nguyen, "Microstrip Impulse Generators with tunable Pulse Duration for Ultra-Wideband Applications," 2003 Asia Pacific Microwave conference, Seoul, Korea, Nov. 2003.

C Hsue, T. Cheng and H Chen, "A second-order microwave differentiator," IEEE Microwave And Wireless Components Letter, vol. 13, No. 3, Mar. 2003.

Barrett, Terence W., "History of Ultra-wideband Radar &Communications: Pioneers and Innovators," Proc. of Progress in electromagnetics Symp. 2000, Cambridge, MA, Jul. 2000.

(Continued)

*Primary Examiner*—Ted M Wang
(74) *Attorney, Agent, or Firm*—Molly L. Sauter; Smith & Hopen, P.A.

(57) ABSTRACT

The present invention provides a single-stage tunable Ultra-Wideband (UWB) pulse generator, by creating and differentiating a variable edge rate signal. Edge rate variability is introduced by first applying a step recovery diode (SRD) to compress the edges of the source and then applying a simple RC network to adjust the edge rate. Next, the resulting signal is differentiated using microstrip transmission lines. The tunable generator resulting from this approach demonstrates a Gaussian and monocycle pulses with good symmetry and low distortion over the tunable range.

22 Claims, 5 Drawing Sheets

OTHER PUBLICATIONS

Engler, Harold F., Technical Issues in ultra-Wideband Radar Systems,: 0-8493-4440-9, CRC Press, Inc. pp. 11-50, 1995.

Prather, William D., Baum, Carl E., Lehr, Jane M., et al. Ultra-wideband source and antenna research, IEEE Trans. on Plasma Science vol. 28, No. 5, Oct., pp. 1624-1630, 2000.

Agee, Forest J., Baum, Carl E., Prather, William D., et al., Ultra-wideband transmitter research, IEEE Trans. on Plasma Science, vol. 26, No. 3, p. 860-873, 1998.

"Pulse and waveform generation with step recovery diodes," Agilent Technol., Palo Alto, CA, Applicat. Note 918, 1968.

J. Han and C. Nguyen, "A New Ultra-Wideband, Ultra-Short Monocycle Pulse Generator with Reduced Ringing," IEEE Microwave and Wireless Comp. Letter, vol. 12, No. 6, Jun. 2002.

Hiroyuki Kida. "Measured and Simulated Results of Impulse Generator Using Step Recovery Diode." IEICE Trans. Fundamentals, vol. E88-A, No. 9, Sep. 2005.

Anton, Howard. 1984. Calculus with analytic geometry. 2nd ed. New York: John Wiley & Sons.

Johnson, Howard and M. Graham. 1993. High Speed Digital Design: A Handbook of Black Magic. New Jersey: Prentice Hall.

Maxwell, E., Weller and Harrow J. (2006) Tunable UWB Pulse Generation Based on a Variable Edge-Rate Signal. In: Proceedings of the IEEE Asia Pacific Conference on Circuits and Systems, Dec. 4-7, Singapore: IEEE, (Accepted).

Maxwell, E., Weller, Harrow, J., Ng, A. (2006) Mathematical Reformation of the Ideal Gaussian for Ultra-Wideband Radar Systems. FEF Journal of Interdisciplinary Research (In-Review).

Maxwell, E., Weller, and Harrow, J. (2006). Tunable UWB Pulse Generation Based on a Variable Edge Rate Compression Approach. In: Student Paper Digest of the IEEE Sarnoff Symposium, Mar. 27-28, Princeton University: New Jersey: IEEE Sarnoff Symposium, pp. 13-15.

Maxwell, E., Weller and Harrow, J. (2006). Ultra-Wideband Radar for Enhanced Noninvasive Cancer Diagnostics. In: Proceedings of the 2nd Annual USF Interdisciplinary Graduate Research Symposium, Apr. 5, University of South Florida, Tampa: USF, pp. 52-54.

Maxwell, E., Weller and Harrow, J. (2006). A Variable Edge-Rate Compression Approach to Tunable Ultra-Wideband Pulse Generation. In: Proceedings of the 36th European Radar Conference, Sep. 13-15, Manchester: European Microwave Association, pp. 198-201.

\* cited by examiner

SYSTEM AND METHOD FOR A SINGLE STAGE TUNABLE ULTRA-WIDEBAND PULSE GENERATOR

CROSS REFERENCE TO RELATED APPLICATIONS

This application claims priority from U.S. Provisional Patent Application No. 60/597,746 filed on Dec. 19, 2005, entitled "System and Method for a Single Stage Tunable Ultra-Wideband Pulse Generator".

STATEMENT OF GOVERNMENT INTEREST

This work was supported in part by the National Science Foundation IGERT program under Grant DGE-0221681.

BACKGROUND OF THE INVENTION

Ultrawideband (UWB) is becoming an attractive radio access solution for wireless communications, particularly for short and medium range applications. According to the modern definition, any wireless communication technology that has a bandwidth wider than 500 MHz or a fractional bandwidth greater than 0.2 can be considered a UWB system. Ultra-wideband (UWB) microwave systems are finding application in the form of sensors for speech aides, impulse radio, as well as respiratory and cardiovascular monitoring. The Federal Communication Commission (FCC) defines UWB as an intentional radiator with an instantaneous 10 dB-fractional and total bandwidth of at least 0.2 and 500 MHz, respectively. This bandwidth is achieved primarily by radiating short pulses that are derived from a basic Gaussian pulse shape.

Tunable pulse generators are useful in UWB radar and radiometric measurement because they provide a platform for optimizing the absorbed and reradiated power of an isolated target. As a result, power optimization may be required for enhancing discrimination and evaluation of electrical characteristics associated with a target. Consequently, a tunable generator can be used to achieve varying penetration depth, radiation intensity and range resolution by controlling the shape and center frequency of the spectrum, because of a targets frequency-dependent electrical property. Thus, tunable pulse generators provide a valuable tool for research requiring UWB measurement of the electrical properties of materials.

One approach for designing a tunable pulse generator is based upon switching in sequential sections of transmission lines to combine short pulses or vary the circuit impedance. These systems often require a number of discrete components in addition to power biasing for each section. Moreover, they often loose their Gaussian symmetry as more pulses are combined for increasing its width.

Accordingly, what is needed in the art is a UWB tunable generator that utilizes fewer components, maintains Gaussian symmetry in the generated signal and allows for easier assembly and a reduction in cost.

SUMMARY OF INVENTION

The present invention provides a pulse-duration tunable generator employing a variable edge-rate signal, thereby providing an improved approach to pulse-duration tuning in UWB signals. The present invention provides a tunable pulse generator using a single stage construction, based on a novel mechanism of applying step recovery diodes towards variable edge rate compression. This approach simplifies the UWB generator design by allowing a focus on generating a precise step and then developing an RF/microwave differentiator.

In accordance with an embodiment of the present invention, a method for generating an ultra-wideband (UWB) pulse is provided. The method includes the steps of, receiving an input signal comprising at least one pulse, the pulse having a rising edge and a falling edge, varying the rising edge and the falling edge of the pulse to generate a tuned pulse, differentiating the tuned pulse to form a Gaussian pulse and differentiating the Gaussian pulse to form a monocycle UWB pulse. In a specific embodiment, the pulse is a rectangular pulse.

The method step of varying the rising edge and the falling edge of the at least one pulse further includes compressing the rising edge and the falling edge of the pulse. In a specific embodiment, compressing the rising edge and the falling edge of the pulse further comprises generating a sharp rising edge of the pulse using a first step recovery diode and generating a sharp falling edge of the pulse using a second step recovery diode. In addition, the rising edge and the falling edge of the pulse are varied by adjusting the slew rate of the rising edge and the falling edge of the pulse. The slew rate of the rising edge and the falling edge of the pulse are varied using an RC network, resulting in a tuned pulse.

The generated tuned pulse is then differentiated to form a Gaussian pulse. In a particular embodiment, the method step of differentiating the tuned pulse further includes differentiating the rising edge of the tuned pulse to form a positive-going Gaussian pulse. In an additional embodiment, the falling edge of the tuned pulse is differentiated to form a negative-going Gaussian pulse. In another embodiment, the turned pulse is attenuated and amplified prior to forming the Gaussian pulse. The Gaussian pulse is then differentiated to provide a monocycle UWB tuned pulse.

While various circuit configurations are within the scope of the present invention for accomplishing the method previously described, in a specific embodiment, a pulse-duration tunable ultra-wideband (UWB) pulse generator is provided including, a variable edge rate pulse compressor, a Gaussian pulse former coupled to the variable edge rate pulse compressor and a differentiator coupled to the Gaussian pulse former.

In a particular embodiment, the variable edge rate pulse compressor further includes a pulse source to provide a pulse having a rising edge and a falling edge, the pulse source having a positive terminal and a negative terminal, a first step recovery diode having a cathode coupled to the positive terminal of the pulse source and an anode coupled to the negative terminal of the pulse source, the first step recover diode to compress the rising edge of the pulse, a second step recovery diode having an anode coupled to the positive terminal of the pulse source and a cathode coupled to the negative terminal of the pulse source, the second step recovery diode to compress the falling edge of the pulse and a resistor coupled to the anode of the second step recovery diode and a capacitor trimmer coupled between the resistor and the cathode of the second step recovery diode to form an RC network, the RC network to control the slew rate of the rising edge and the falling edge of the pulse.

In a particular embodiment, the Gaussian pulse former in accordance with the present invention includes, an attenuator coupled to the variable edge rate compressor, an amplifier coupled to the attenuator, a short circuit stub shunted across the output of the amplifier and the negative terminal of the pulse source, a first diode coupled in parallel with the short circuit stub, having a cathode coupled to the negative terminal of the pulse source and a second diode having a cathode coupled to the anode of the first diode.

In a particular embodiment, the differentiator in accordance with the present invention includes, an attenuator having an input coupled to the Gaussian pulse former and an output, a matching resistor coupled between the output of the attenuator and the negative terminal of the pulse source, a short circuit stub coupled in parallel with the matching resistor and a load resistor coupled in parallel with the short circuit stub.

In a particular embodiment, the waveforms that result from the tunable pulse generator of the present invention demonstrate good Gaussian symmetry through out a tuning range of 800 ps to 1150 ps using a 1-20 pF capacitance trimmer. In addition, these circuits require only a single DC source, no biasing and 8 discrete components. Moreover, they show good agreement between simulated and measured data. Consequently, this approach is applicable to any application, which requires a tunable UWB source.

BRIEF DESCRIPTION OF THE DRAWINGS

For a fuller understanding of the invention, reference should be made to the following detailed description, taken in connection with the accompanying drawings, in which:

FIG. 2 is graphical representation of simulated and measured waveforms at 1, 2, 5, 10 and 20 pF capacitance values (from left to right); A: Simulated data at variable edge rate compressor; B: Measured data at the variable edge rate compressor.

FIG. 3 is a graphical representation of simulated and measured Gaussian waveforms at 1, 2, 5, 10 and 20 pF capacitance values (from left to right); A: Simulated Gaussian pulse at the output of the pulse shaper ($1^{st}$ derivative of the edge rate compressor output); B: Measured Gaussian pulse at the aforementioned capacitance values.

FIG. 4 is a graphical representation of simulated and measured monocycle waveforms at 1, 2, 5, 10 and 20 pF capacitance values (from left to right); A: Simulated monocycle pulse resulting from a 2nd derivative of the pulse forming sub-circuit; B: Measured monocycle pulse resulting from a derivative of the Gaussian.

FIG. 5 is a graphical representation of the shaped spectrum for the FCC mask for medical imaging and the normalized frequency response of waveforms generated using a 1 pF and 10 pF capacitance value; A: Response of Gaussian waveform; B: Response of monocycle waveform.

DETAILED DESCRIPTION OF THE PREFERRED EMBODIMENT

Figure 1:
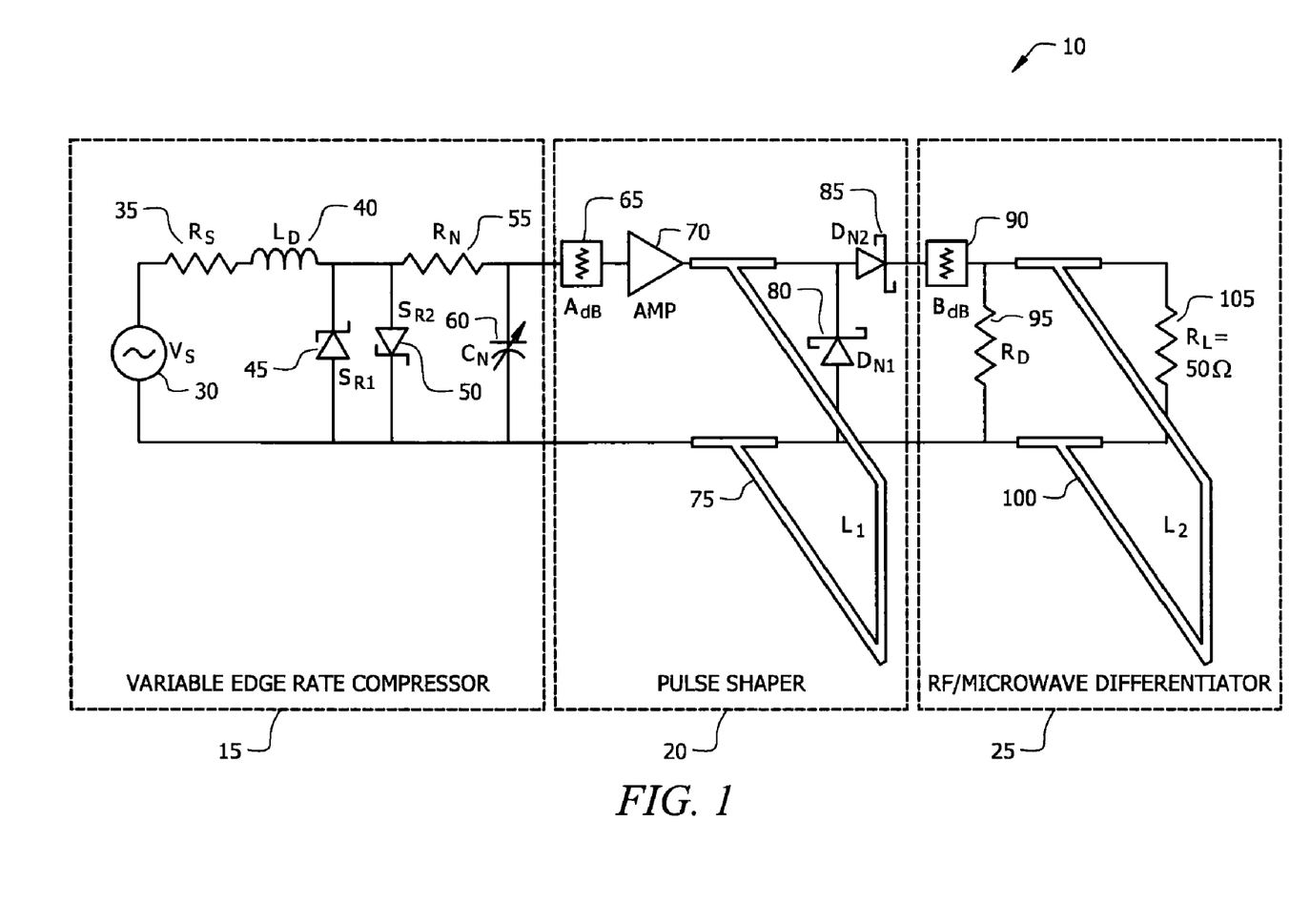
FIG. 1 is a schematic of a single-stage tunable UWB generator in accordance with an embodiment of the present invention.
Figure 2A:
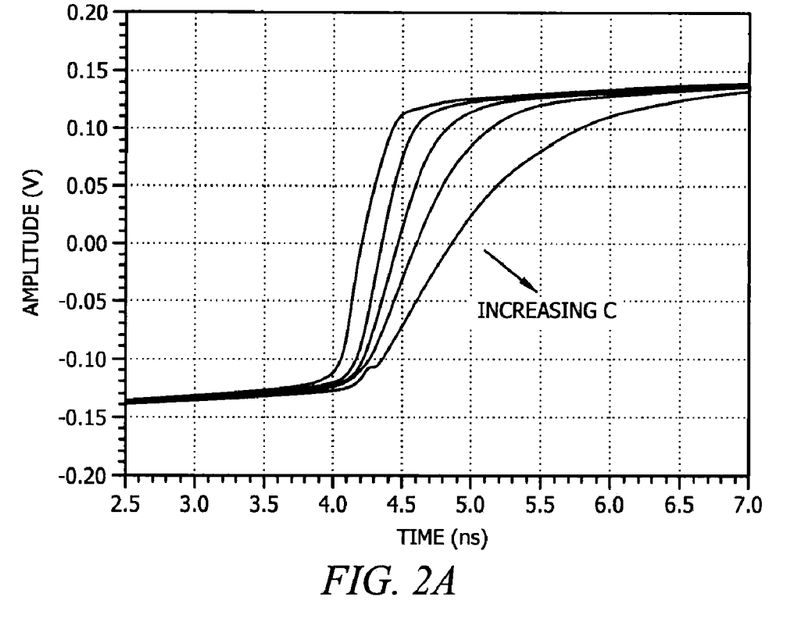
Figure 2B:
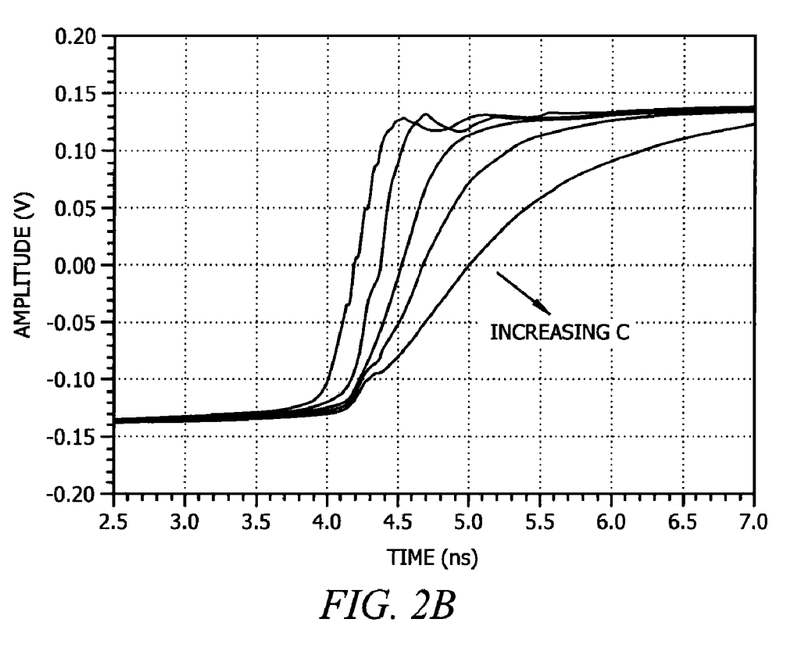

With reference to FIG. 1, a single stage tunable pulse generator 10 in accordance with an embodiment of the present invention is implemented with three sub-circuits, including: a variable edge rate compressor 15, pulse former 20 and an RF/microwave differentiator 25.

The variable edge rate compressor sub-circuit 15 provides a mechanism for producing a tunable pulse width by allowing slew rate control. A voltage source 30 in combination with a resistor 35 and an inductor 40 provide the pulsed source for the generator. In a particular embodiment, the variable edge rate compressor sub-circuit includes a first step recovery diode 45 to rapidly charge up and snap back on the rising edges of the source 30 and a second step recovery diode 50 to rapidly charge up and snap back on the falling edges of the source 55. Although a sharp falling edge is not typically used in the construction of a Gaussian waveform, the corresponding step recovery diode 50 contributes to the pulse shape, width and low distortion achieved in this circuit. The edge-rate associated with the rectangular pulse that results from the step recovery diode is controlled with a simple RC network including a resistor 55 and a capacitor trimmer 60. In a particular embodiment, the resistor is a 60-ohm chip resistor. The value of the resistor is determined by optimizing the pulse shape in ADS. The RC time constant that results from this network provides a means to vary signal rise time by modifying the capacitance. The capacitance may be determined by first recognizing that the series inductance and shunt capacitance forms a first order low-pass filer. The cut-off frequency for this filter is obtained from the reciprocal of the step-function rise time. Consequently, the low-pass filter inductance ($L_k$) and capacitance ($C_k$) are defined by the following equations:

$$L'_k = \frac{R_o \cdot L_k}{\omega_c} \quad (1)$$

$$C'_k = \frac{C_k}{R_o \cdot \omega_c} \quad (2)$$

Where $R_o$ is the circuit resistance, $C_k$ is the normalized capacitance, $L_k$ is the normalized impedance and $\omega^c$ is the cut-off frequency. Since this circuit is based on achieving pulse-duration tuning by modifying the step-function rise time, a minimum and maximum rise time is used to constrain the filter elements. The full rise time associated of the step recovery diode is used to limit the minimum step-function rise time. However, this time does not account for the diode junction capacitance since it is measured in a test fixture. In addition, the transition time is measured between a 20-80% rise in amplitude. A 10 ns minority carrier lifetime is used to limit the maximum step-function rise time because it affects the operation frequency of the diode. These limits are applied to equations (1) and (2) above using normalized element values, which correspond to a maximally flat pass-band. Accordingly, an inductance range of about 4.0-3.5 nH and capacitance range of about 0.17-14.5 pF results. As such, the inductance and the capacitance for the circuit are implemented with a 0.35 nH chip inductor and a capacitor trimmer with a 1-20 pF range.

The resulting variable edge-rate signal provided by the variable edge-rate generator sub-circuit is then passed to the pulse former sub-circuit, which forms a Gaussian pulse. The pulse forming sub-circuit 20 of the present invention is used to differentiate the sharp edges generated by the edge compressor 15. The pulse forming sub-circuit includes an amplifier 70 to provide wideband isolation. In a specific embodiment, the amplifier provides 21 dB of gain and 35 dB of isolation over an 80 kHz-9.3 GHz bandwidth. The pulse forming sub-circuit 20 also includes an attenuator 60 to meet the input power requirement of the amplifier 70. In a specific embodiment, an attenuator 60 of 6 dB is used to help meet the 0 dB input power requirement for the amplifier. The pulse-forming sub-circuit 20 includes a pulse forming network that is used to differentiate the incoming rectangular pulse. Since the pulse-forming network includes a differentiator, the initial value for the length L1 of the short circuit stub 75 was set to a quarter wavelength of the maximum frequency. Since the maximum frequency is determined from the rise time, the length may be expressed by the following equation:

$$\text{Length} = 1.2 \cdot \frac{\tau_{10-90\%}}{4 \cdot \sqrt{\varepsilon \cdot \mu}} \quad (3)$$

where $\varepsilon$ is the electric permittivity, $\mu$ is the magnetic permeability, and the factor of 1.2 is applied to approximate the full rise time from the 10-90% rise time ($\tau_{(10-90\%)}$). The resulting length was then optimized in ADS to achieve a desirable ripple and overshoot. As a result, in a particular embodiment, the pulse forming network is constructed from a short circuit stub 75 with a length L1 of 103 mm and a width of 2.5 mm. Since the resulting Gaussian contains both positive and negative-going pulses, a pair of Schottky barrier diodes 80, 85 was used to clamp the negative going reflections by providing a ground path through diode 80 as well as blocking through diode 85.

The Gaussian pulse resulting from the shape forming sub-circuit 20 is then passed to the RF/microwave differentiator sub-circuit 25 where a monocycle is formed. The differentiator sub-circuit 25 includes an attenuator 90 to minimize circuit reflections. In a particular embodiment, the attenuator 90 is a DC-29 GHz 3 dB attenuator. The differentiator sub-circuit 25 includes a resistor 95 for matching, a load resistor 105 and a short circuit stub 100. In a particular embodiment the resistor 95 is a 100-ohm resistor and the short circuit stub 100 is about 80 mm long and has a width of about 1.25 mm.

In accordance with an exemplary embodiment of the present invention, the setup used to test the generator in accordance with the present invention includes an Agilent 33120A arbitrary waveform generator to produce the 14 MHz 10 Vpp sinusoidal stimulus required at the input of the circuit and an HP 54750A digitizing oscilloscope with an HP54715A 20 GHz module to capture the output. All measured data obtained from this setup was compared to that simulated using Advanced Design System (ADS) 2003A.

The simulation and measurement data presented in FIG. 2-FIG. 5, were taken on each of the described sub-circuits as previously described. FIG. 3 demonstrates the tuning range of the variable edge-rate compressor sub-circuit 15 as the capacitance 60 is varied from 1-20 pF. The amplitude associated with the waveforms in this figure is a function of the amount of charge that is available from the step recovery diodes at the time of the snap. Since voltage amplitude may be expressed mathematically as the equivalent charge over the total capacitance, it is expected that the signal amplitude would decrease with an increase in the circuit's capacitance. Consequently, as the capacitance is trimmed it is shown that the signal rise time decreases while the amplitude increases. Good agreement between the simulated FIG. 2(A) and measured FIG. 2(B) may be observed in FIG. 2.

Figure 3A:
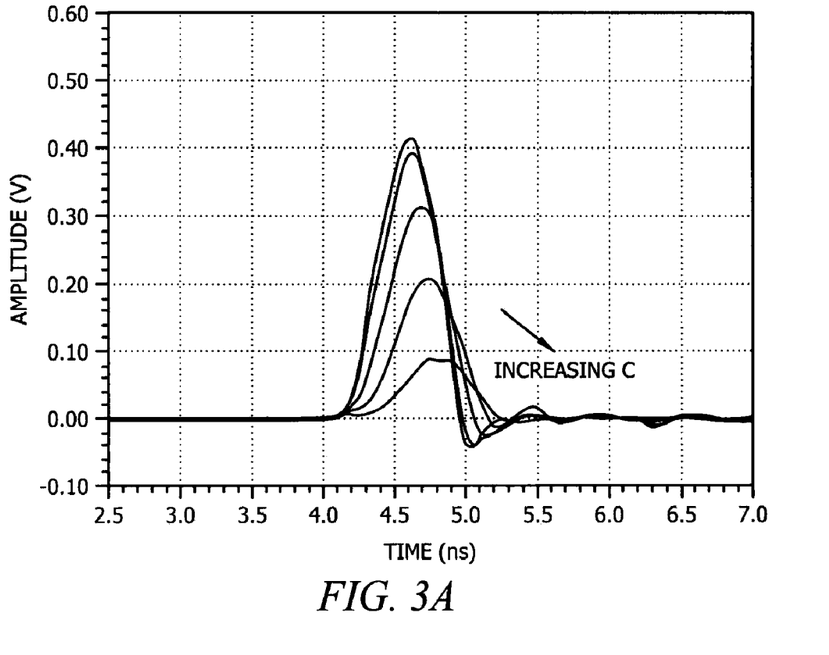
Figure 3B:
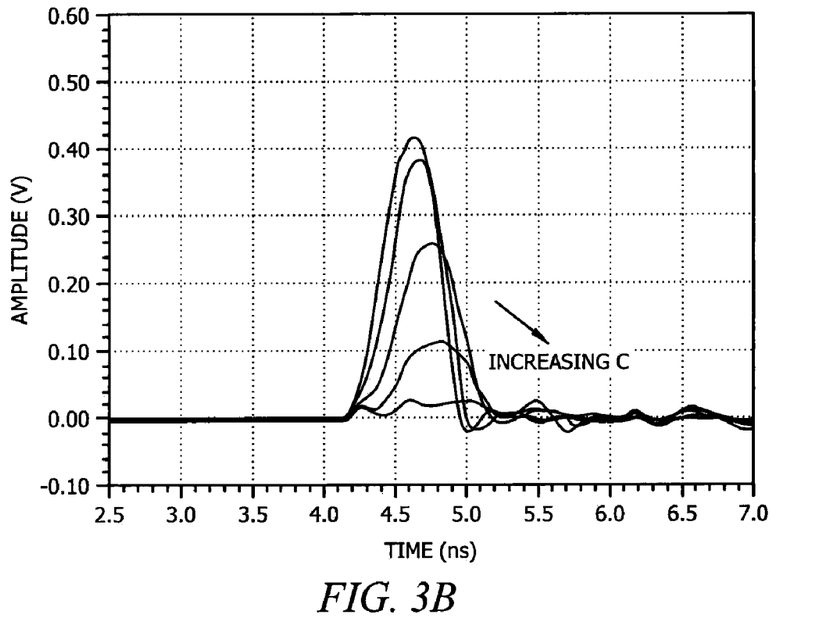

FIG. 3 illustrates the output of the pulse forming sub-circuit 20. FIG. 3(A) illustrates the simulated data and FIG. 3(B) illustrates the measured data resulting from the pulse forming sub-circuit 20. The results from FIG. 3 demonstrate low distortion and good agreement between the simulated and measured data. It is shown that the waveform increases in width as the capacitance is increased from 1 pF where it is 800 ps wide to 20 pF where the waveform is 1150 ps wide. The shape of the waveform remains Gaussian throughout the tunable range and demonstrates a distinct peak-amplitude as well as a slope that varies as a function of pulse width. Consequently, this UWB generator demonstrates Gaussian pulses that are in good agreement with the ideal Gaussian across the tuning range. Although there is good agreement in shape, the amplitude more sharply decreases in the measured versus simulated results with an increase in capacitance, i.e., the simulated amplitude at 20 pF is about 25 mV whereas its measured amplitude is at maximum of 5 mV. Consequently, the measured amplitude at 20 pF is very close to the ringing noise that passes through the pulse former 20. However, the Gaussian shape may be restored by increasing the gain of the amplifier 70 at the input of the pulse forming sub-circuit.

Figure 4A:
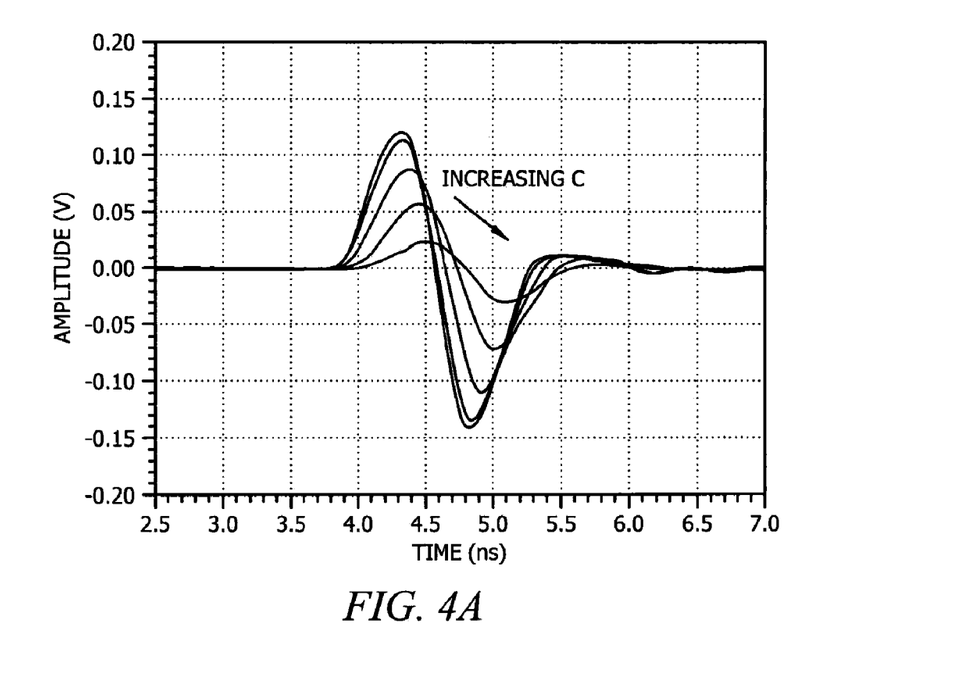
Figure 4B:
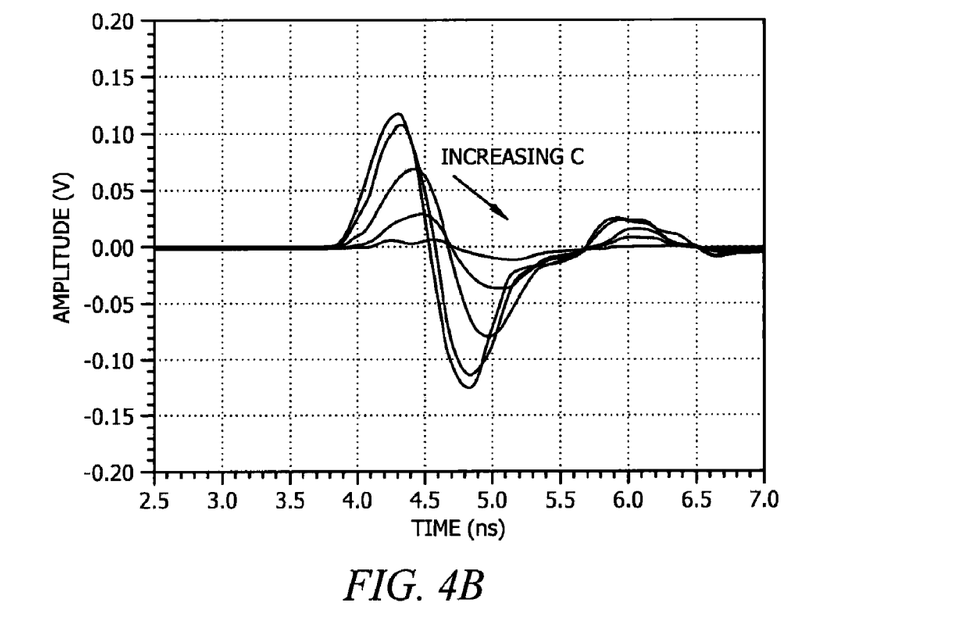

The RF/microwave differentiator sub-circuit 25 takes the Gaussian produced in the pulse forming sub-circuit and generates a monocycle pulse. FIG. 4 shows the simulated waveforms in FIG. 4(A) and measured waveforms in FIG. 4(B) resulting from the RF/microwave differentiator sub-circuit 25. As demonstrated, the monocycles are tunable over the 1-20 pF capacitance range. As illustrated, a monocycle having a 1.6 ns width, results from differentiating the 800 ps Gaussian. The differentiator used in this sub-circuit 25 produces pulses that have closely matched amplitudes at the positive and negative levels.

Figure 5A:
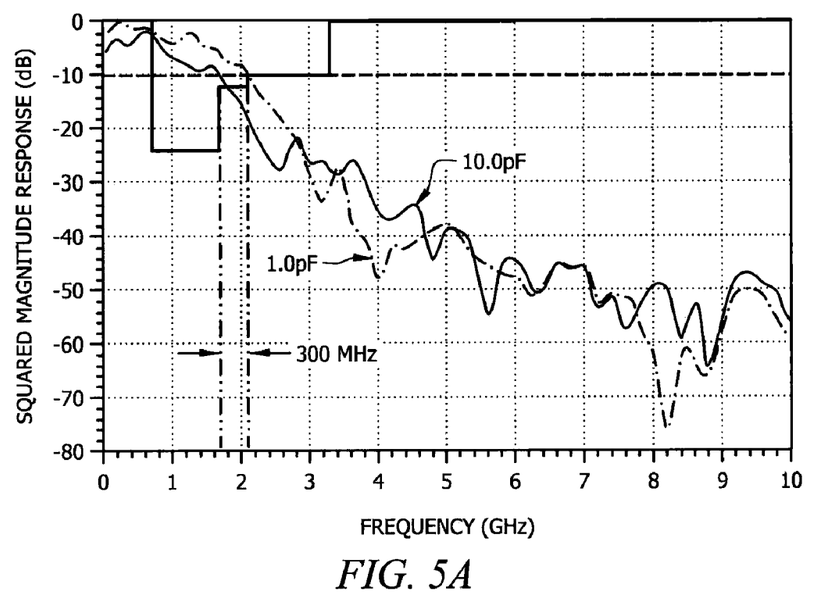
Figure 5B:
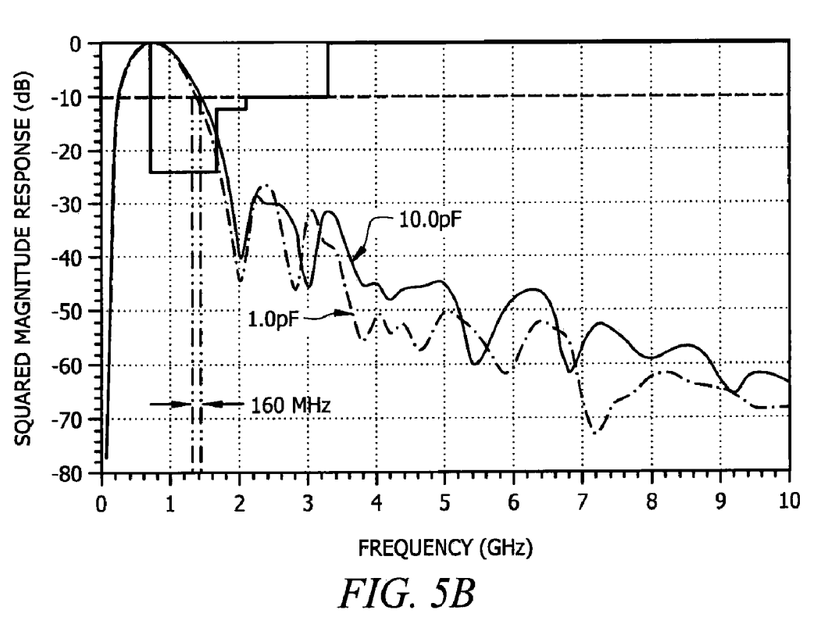

With reference to FIG. 5, the normalized spectrum associated with the Gaussian and monocycle waveforms shown in FIG. 3 and FIG. 4 are illustrated. FIG. 5(A) and FIG. 5(B) illustrate that the tuning range and bandwidth decreases upon the application of a second derivative in the RF/microwave differentiator sub-circuit. In this exemplary embodiment, the tuning range measures 300 MHz and 160 MHz for the Gaussian and monocycle, respectively. Likewise the bandwidth associated with the 10 pF capacitance measures 1.4 GHz for the monocycle spectrum in FIG. 5(B) and 1.7 GHz for the Gaussian spectrum of FIG. 5(A). The results are shown in comparison to the shaped spectrum of the FCC mask for medical imaging.

The present invention provides a tunable pulse generator using a single stage construction, based on a novel mechanism of applying step recovery diodes towards variable edge rate compression. This approach simplifies UWB generator design by allowing a focus on generating a smooth slope for the step in a rectangular pulse and then developing RF/microwave differentiators. The waveforms that result from this approach demonstrate good Gaussian symmetry through out a tuning range of 800 ps to 1150 ps using a 1-20 pF capacitance trimmer. In addition, these circuits require only an AC input and DC supply for the amplifier, do not require any biasing and contain only 8 discrete components. Moreover, they show good agreement between simulated and measured data. Consequently, this approach should be useful for any application that requires a tunable UWB source.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed is:

1. A method for generating an ultra-wideband (UWB) pulse, the method comprising:
   receiving an input signal comprising at least one waveform, the at least one waveform having a rising edge and a falling edge;
   generating a tuned square wave from the at least one waveform, the turned square wave generated by compressing the rising edge of the at least one waveform using a first step recovery diode, by compressing the falling edge of the at least one waveform using a second step recovery diode and by controlling the slew rate of the rising edge and the falling edge of the at least one waveform using an RC network;

differentiating the tuned square wave to form a Gaussian pulse; and differentiating the Gaussian pulse to form a monocycle UWB pulse.

2. The method of claim 1, wherein the at least one waveform is a square waveform.

3. The method of claim 1, wherein compressing the rising edge and the falling edge of the at least one waveform further comprises generating a sharp rising edge of the at least one waveform and generating a sharp falling edge of the at least one waveform.

4. The method of claim 1, wherein differentiating the tuned square wave further comprises differentiating the rising edge of the tuned square wave to form a positive-going Gaussian pulse.

5. The method of claim 1, wherein differentiating the tuned square wave further comprises differentiating the falling edge of the tuned square wave to form a negative-going Gaussian pulse.

6. The method of claim 1, further comprising attenuating the tuned square wave prior to differentiating the tuned square wave.

7. The method of claim 1, further comprising amplifying the tuned square wave prior to differentiating the tuned square wave.

8. The method of claim 1, further comprising attenuating the Gaussian pulse prior to differentiating the Gaussian pulse.

9. A pulse-duration tunable ultra-wideband (UWB) pulse generator comprising:

a variable edge rate compressor to receive a waveform having a rising edge and a falling edge, the variable edge rate compressor comprising:

a first step recovery diode having an anode and a cathode, the first step recovery diode to compress the rising edge of the received waveform;

a second step recovery diode having an anode coupled to the cathode of the first step recovery diode and a cathode coupled to the anode of the first step recovery diode, the second step recovery diode to compress the falling edge of the received waveform; and a resistor coupled to the anode of the second step recovery diode and a capacitor trimmer coupled between the resistor and the cathode of the second step recovery diode to form an RC network, the RC network to control the slew rate of the rising edge and the falling edge of the received waveform;

a Gaussian pulse former coupled to the variable edge rate compressor; and a differentiator coupled to the Gaussian pulse former.

10. The UWB pulse generator of claim 9, wherein the variable edge rate compressor further comprises:

a waveform source to provide the waveform having a rising edge and a falling edge, the waveform source having a positive terminal and a negative terminal, the positive terminal coupled to the cathode of the first step recovery diode and the anode of the second step recovery diode and the negative terminal coupled to the anode of the first step recovery diode and the cathode of the second step recovery diode.

11. The variable edge rate compressor of claim 10, wherein the waveform source to provide the waveform having a rising edge and a falling edge further comprises a resistor and an inductor in series with the positive terminal of an alternating current source.

12. The UWB pulse generator of claim 9, wherein the Gaussian pulse former further comprises:

an attenuator coupled to the variable edge rate compressor;

an amplifier coupled to the attenuator;

a short circuit stub shunted across the output of the amplifier and the negative terminal of the waveform source;

a first diode coupled in parallel with the short circuit stub, having a cathode coupled to the negative terminal of the waveform source; and a second diode having a cathode coupled to the anode of the first diode.

13. The UWB pulse generator of claim 9, wherein the differentiator further comprises:

an attenuator having an input coupled to the Gaussian pulse former and an output;

a matching resistor coupled between the output of the attenuator and the negative terminal of the waveform source;

a short circuit stub coupled in parallel with the matching resistor; and a load resistor coupled in parallel with the short circuit stub.

14. The UWB pulse generator of claim 10, wherein the waveform provided by the waveform source is a square wave.

15. The UWB pulse generator of claim 10, wherein the waveform provided by the pulse source is a sinusoid.

16. The UWB pulse generator of claim 9, wherein the differentiator is a radio frequency differentiator.

17. The UWB pulse generator of claim 9, wherein the differentiator is a microwave frequency differentiator.

18. The UWB pulse generator of claim 10, wherein the resistor is a 60-ohm resistor.

19. The UWB pulse generator of claim 10, wherein the capacitor trimmer is a 1-20 pF capacitor trimmer.

20. The UWB pulse generator of claim 12, wherein the short circuit stub has a length of about 103 mm and a width of about 2.5 mm.

21. The UWB pulse generator of claim 13, wherein the matching resistor is a 100-ohm resistor.

22. The UWB pulse generator of claim 13, wherein the short circuit stub has a length of about 80 mm and a width of about 1.25 mm.

* * * * *